(12) United States Patent
Tai (10) Patent No.: US 7,557,670 B1
(45) Date of Patent: Jul. 7, 2009

(54) CIRCUIT AND METHOD FOR GENERATING A CONTINUOUS PULSE SIGNAL

(75) Inventor: Jy-Der David Tai, Sanchong (TW)

(73) Assignee: Tai-1 Microelectronics Corp., Taipei County (TW)

( * ) Notice: Subject to any disclaimer, the term of this patent is extended or adjusted under 35 U.S.C. 154(b) by 47 days.

(21) Appl. No.: 12/025,037

(22) Filed: Feb. 3, 2008

(30) Foreign Application Priority Data

Dec. 21, 2007 (TW) ............................... 96149233 A (51) Int. Cl.
*H03K 7/08* (2006.01)
(52) U.S. Cl. ..................................................... 332/109
(58) Field of Classification Search ......... 332/109–111; 327/172–177; 375/238
See application file for complete search history.

(56) References Cited

U.S. PATENT DOCUMENTS 7,492,219 B1 * 2/2009 Cyrusian ..................... 330/10

* cited by examiner

Primary Examiner—David Mis
(74) Attorney, Agent, or Firm—Ming Chow; Sinorica, LLC (57) ABSTRACT

The present invention discloses a circuit and method for generating a continuous pulse signal. The circuit of the present invention comprises: a PWM device generating a clock signal and a PWM signal, and a pulse continuity detector coupled to the PWM device. The pulse continuity detector further comprises: a positive pilot signal generator, a negative pilot signal and a multiplexer. The positive pilot signal generator is coupled to the PWM device to receive the clock signal and the PWM signal and then outputs a positive pilot signal. The negative pilot signal generator is coupled to the PWM device to receive the clock signal and the PWM signal and then outputs a negative pilot signal. The multiplexer is coupled to the PWM device, the positive pilot signal generator and the negative pilot signal generator to receive the PWM signal, the positive pilot signal and the negative pilot signal, and outputs the positive pilot signal or the negative pilot signal according to the PWM signal. Thus, the present invention can provide a continuous pulse signal and prevent the pulse signal from being interrupted.

19 Claims, 9 Drawing Sheets

CIRCUIT AND METHOD FOR GENERATING A CONTINUOUS PULSE SIGNAL

BACKGROUND OF THE INVENTION

1. Field of the Invention

The present invention relates to a circuit and method for generating a pulse signal, particularly to a circuit and method for generating a continuous pulse signal.

2. Description of the Related Art

Figure 1:
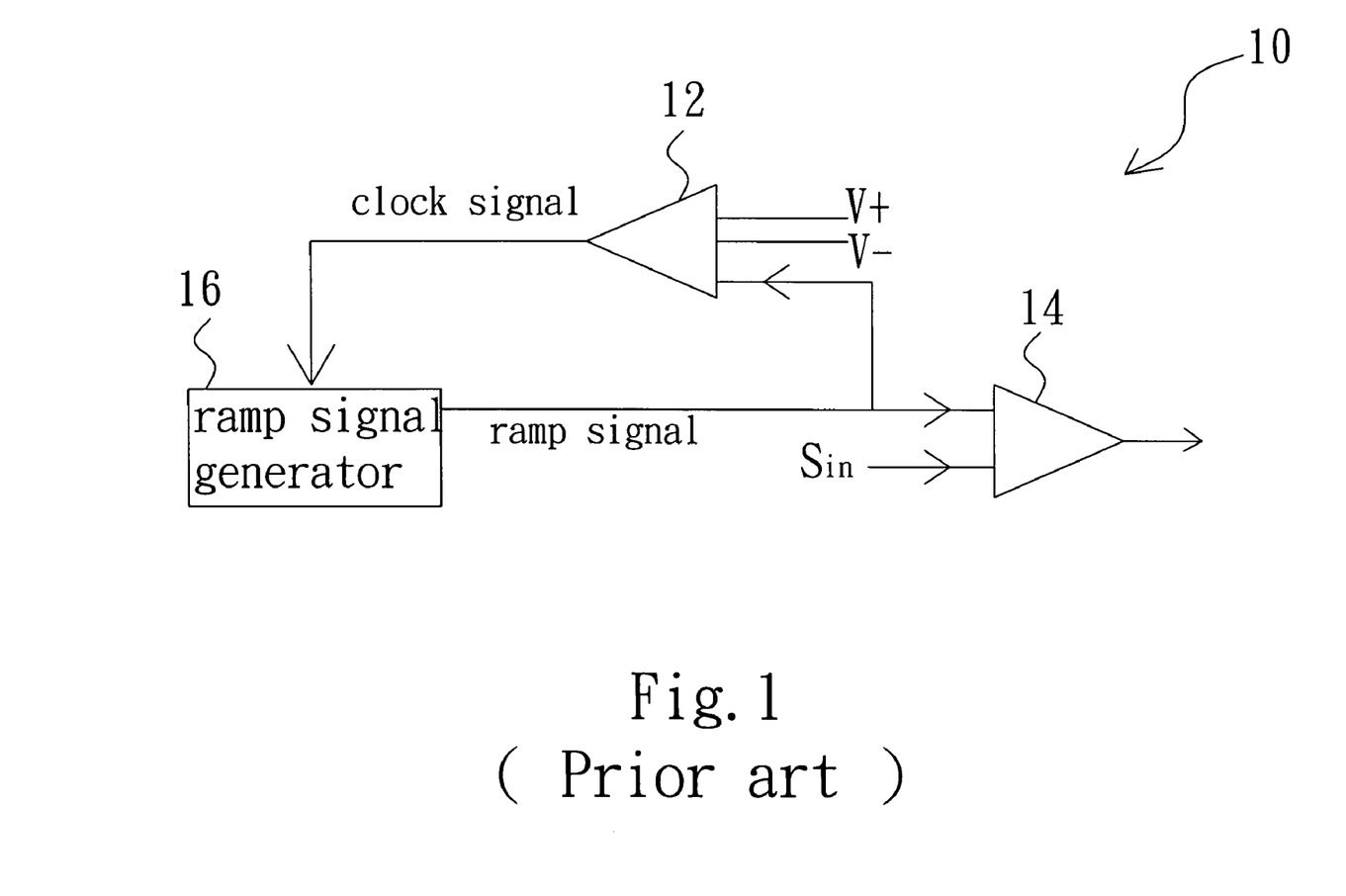
FIG. 1 is a diagram schematically showing the circuit of a conventional PWM device.
Figure 2:
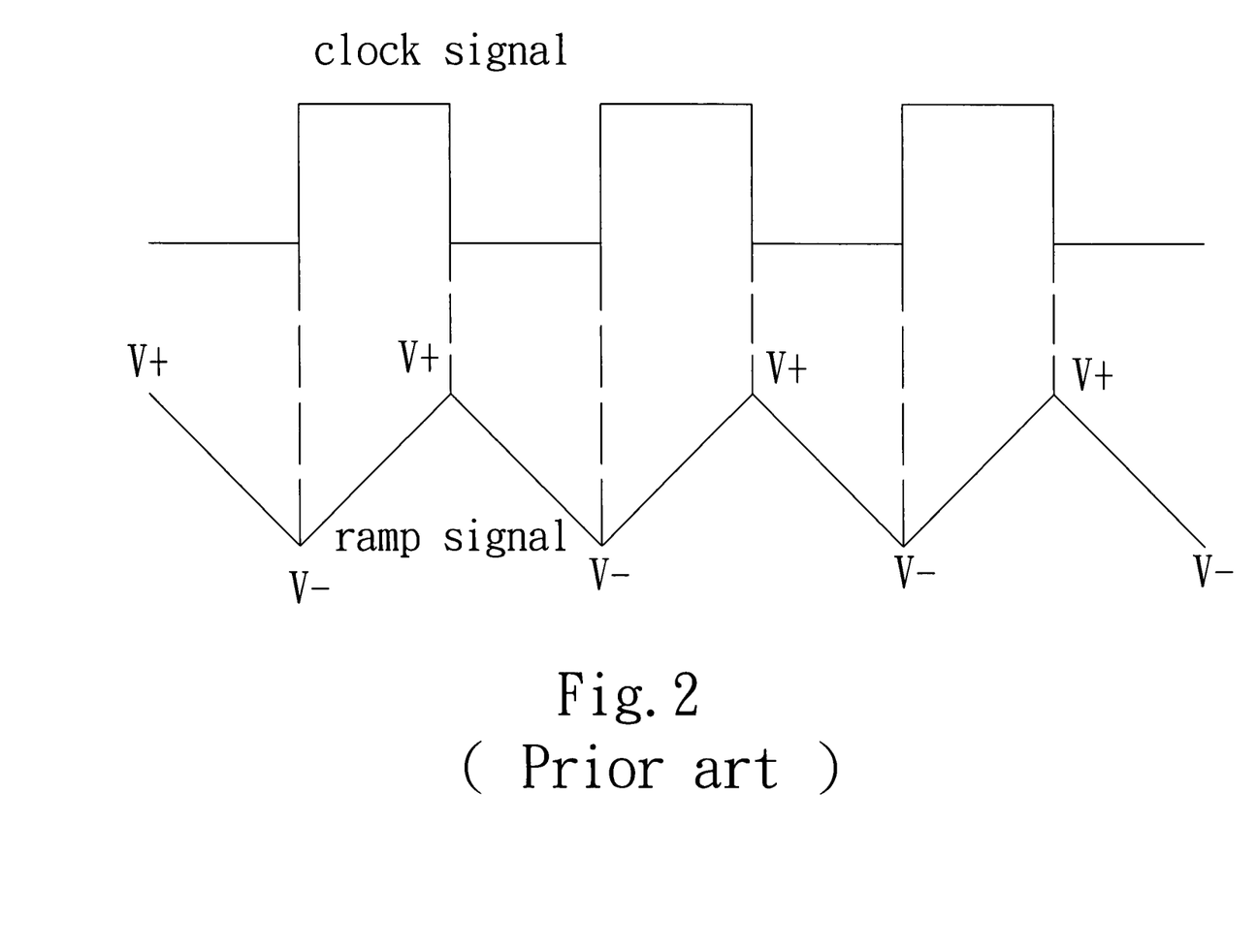
FIG. 2 is a diagram schematically showing the rectangular waveform generated by the comparator and the triangular waveform generated by the ramp signal generator in a conventional PWM device.

Refer to FIG. 1 a diagram schematically showing the circuit of a conventional PWM (Pulse Width Modulation) device. The conventional PWM device 10 comprises: a comparator 12, a comparator 14 and a ramp signal generator 16, wherein the comparators 12 and 14 are coupled to each other, and the ramp signal generator 16 is coupled to the comparators 12 and 14. Refer to FIG. 2. The comparator 12 receives a high DC reference voltage V+ and a low DC reference voltage V− and outputs a clock signal. The ramp signal generator 16 then receives the clock signal and outputs a ramp signal to the comparators 12 and 14.

When the value of the ramp signal reaches the high DC reference voltage V+, the comparator 12 outputs a low-level clock signal to the ramp signal generator 16 to change the direction of the ramp signal, and the ramp signal begins to descend. When the value of the ramp signal reaches the low DC reference voltage V−, the comparator 12 outputs a high-level clock signal to the ramp signal generator 16 to change the direction of the ramp signal, and the ramp signal begins to ascend. Thus, the ramp signal is confined to between the high DC reference voltage V+ and the low DC reference voltage V−. Besides, the ramp signal is not necessarily the triangular waveform shown in FIG. 2 but may be a sawtooth waveform.

Figure 3A:
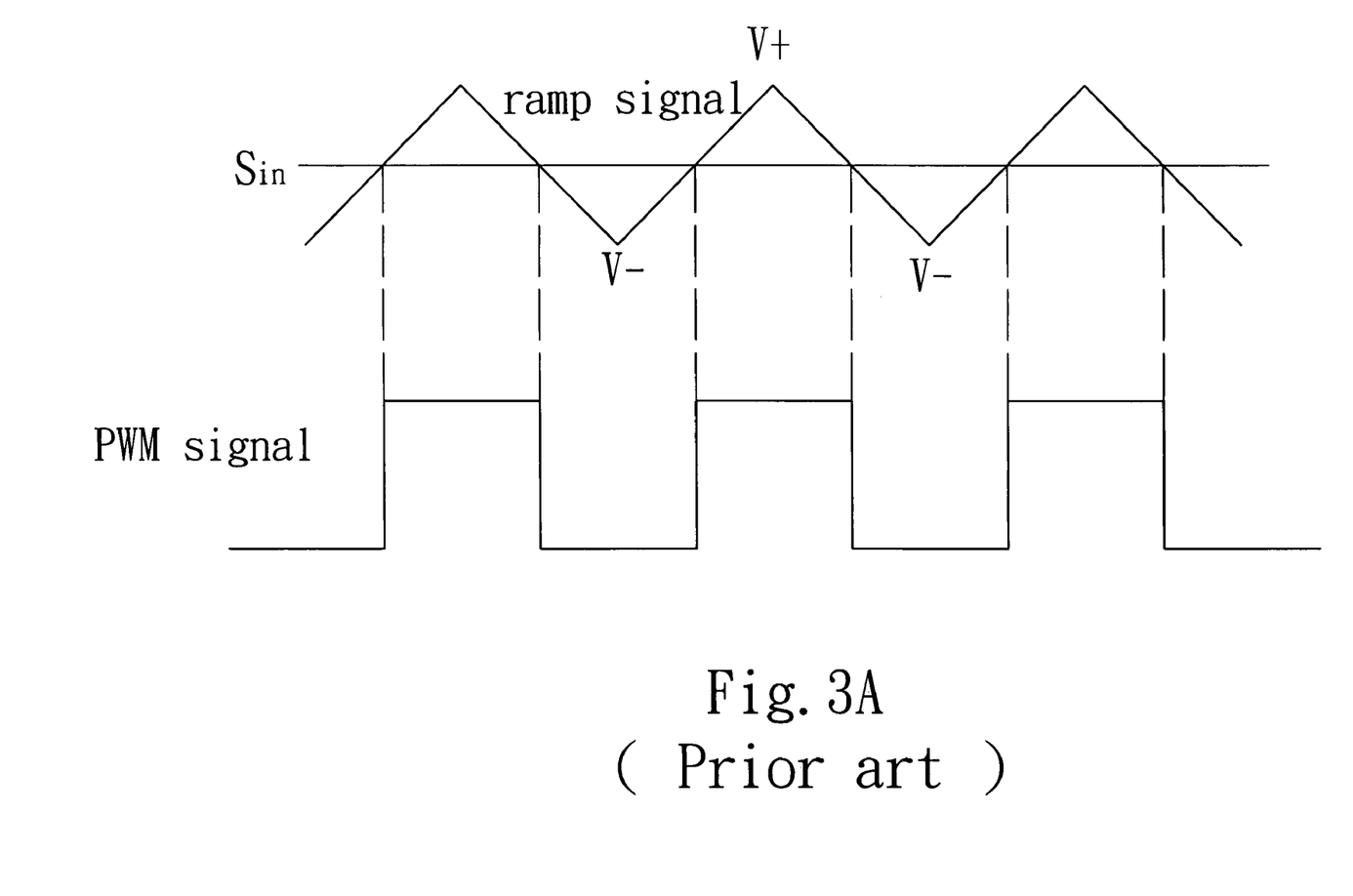
FIG. 3A to FIG. 3C are diagram schematically showing that a comparator receives a ramp signal and different input signals $S_{in}$ and then outputs different PWM signals in a conventional PWM device.
Figure 3B:
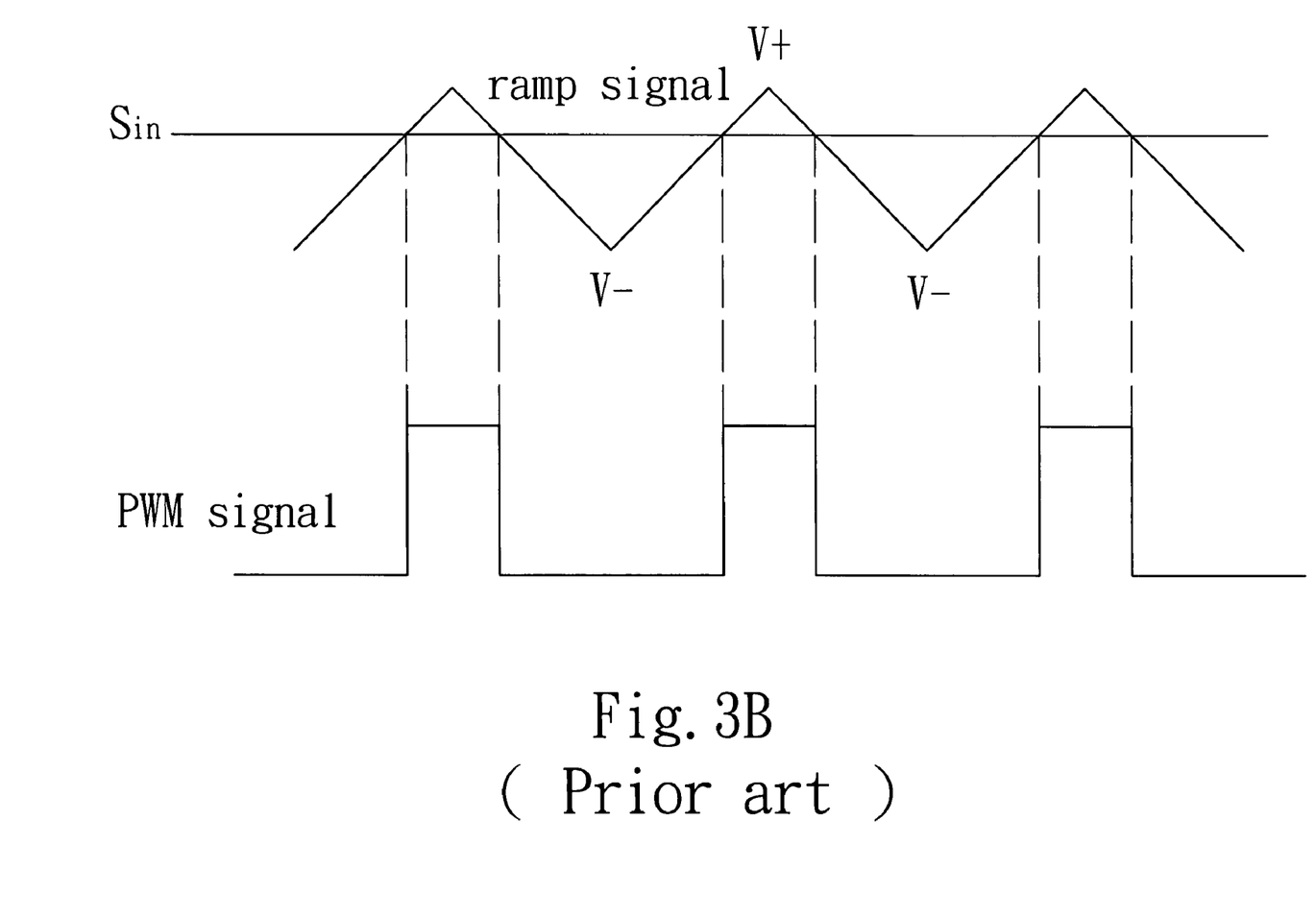
Figure 3C:
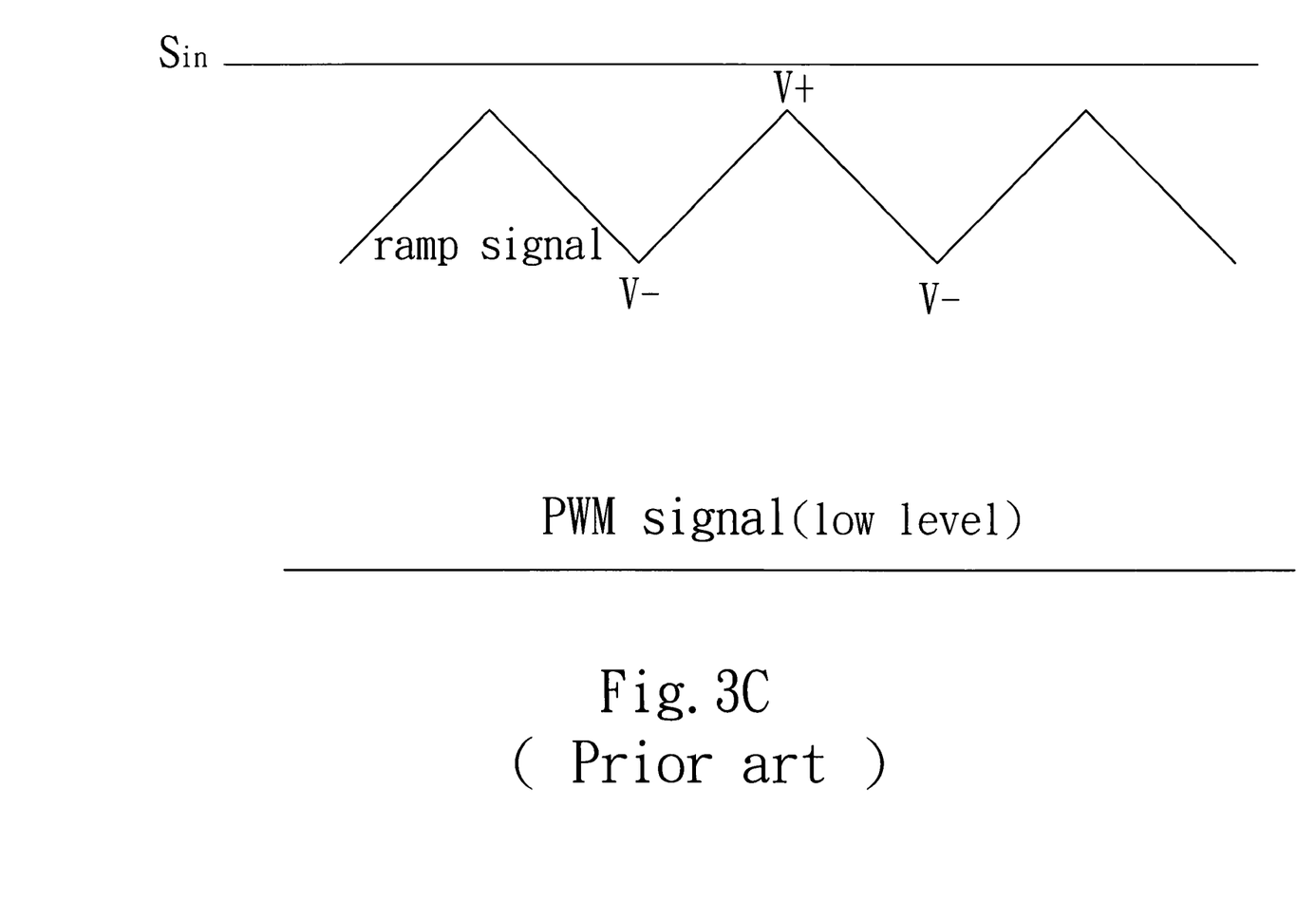

The comparator 14 receives the ramp signal and an input signal $S_{in}$ and compares them to output a PWM signal. Refer to FIG. 3A. When the value of the input signal $S_{in}$ is at the half of the ramp signal, the PWM signal is a pulse train having a 50% duty cycle. Refer to FIG. 3B. When the value of the input signal $S_{in}$ is at between the high DC reference voltage V+ and the half of the ramp signal, the PWM signal is a pulse train having a duty cycle less than 50%. Refer to FIG. 3C. When the value of the input signal $S_{in}$ is over the high DC reference voltage V+, the PWM signal is completely a low-level signal. However, such a phenomenon is abnormal. In other words, the conventional PWM device 10 has an intrinsic disadvantage: once the input signal $S_{in}$ is over the range, the pulse signal is interrupted.

Accordingly, the present invention proposes a circuit and method for generating a continuous pulse signal to solve the abovementioned problem.

SUMMARY OF THE INVENTION

One objective of the present invention is to provide a novel circuit and method for generating a continuous pulse signal, wherein a PWM device cooperates with a pulse continuity detector to generate a continuous pulse signal and prevent the pulse signal from being interrupted, and wherein the PWM device generates a clock signal and a PWM signal, and wherein the pulse continuity detector receives the clock signal and the PWM signal and generates an output signal according to whether the PWM signal is a high-level signal or a low-level signal.

According to the present invention, the circuit for generating a continuous pulse signal comprises: a PWM device and a pulse continuity detector coupled to the PWM device. The PWM device generates a clock signal and a PWM signal. The pulse continuity detector further comprises: a positive pilot signal generator, a negative pilot signal generator and a multiplexer. The positive pilot signal generator receives the clock signal and the PWM signal and outputs a positive pilot signal. The negative pilot signal generator receives the clock signal and the PWM signal and outputs a negative pilot signal. The multiplexer is coupled to the PWM device, the positive pilot signal generator and the negative pilot signal generator to receive the PWM signal, the positive pilot signal and the negative pilot signal. The multiplexer outputs the positive pilot signal or the negative pilot signal according to the PWM signal.

When the PWM signal is a high-level signal, the multiplexer outputs the negative pilot signal. When the PWM signal is a low-level signal, the multiplexer outputs the positive pilot signal.

According to the present invention, the method for generating a continuous pulse signal comprises: providing a PWM signal and a clock signal; generating a positive pilot signal and a negative pilot signal according to the PWM signal and the clock signal; and outputting the positive pilot signal or the negative pilot signal according to whether the PWM signal is a high-level signal or a low-level signal.

When the PWM signal is a high-level signal, the multiplexer outputs the negative pilot signal. When the PWM signal is a low-level signal, the multiplexer outputs the positive pilot signal.

Since the specification of the present invention is to demonstrate the present invention and make the present invention easily understood, any modification or variation according to the spirit of the present invention is obvious for the persons skilled in the art and should be included within the scope of the present invention.

DETAILED DESCRIPTION OF THE INVENTION

Figure 4:
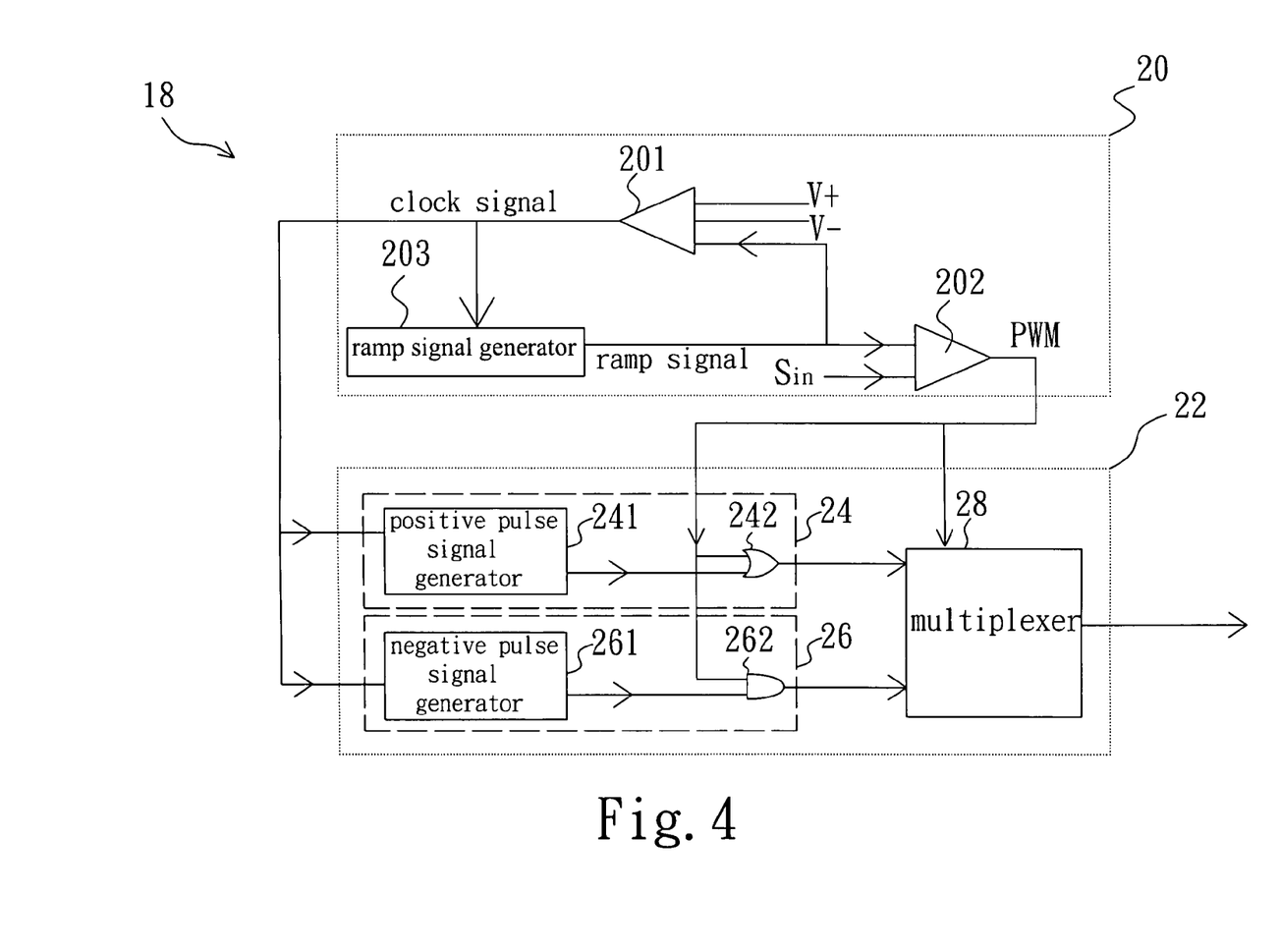
FIG. 4 is a diagram schematically showing a circuit for generating a continuous pulse signal according to the present invention.
Figure 5A:
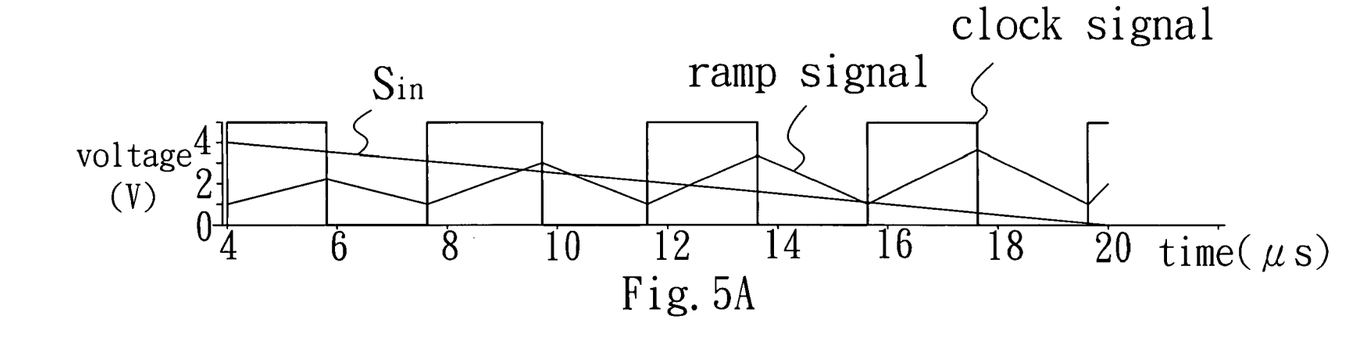
FIG. 5A is a diagram schematically showing a clock signal, a ramp signal and an input signal $S_{in}$ according to the present invention.
Figure 5B:
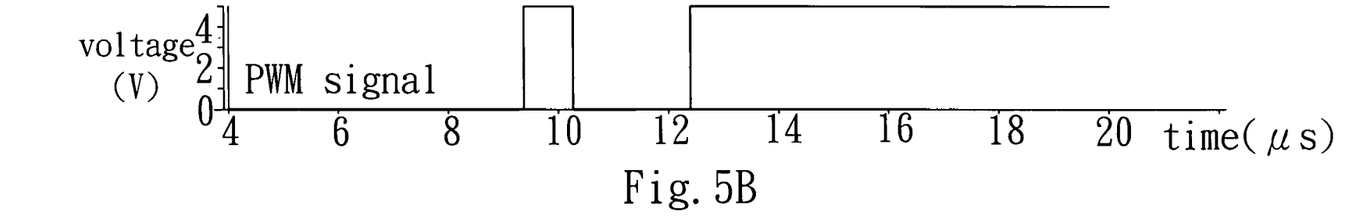
FIG. 5B is a diagram schematically showing a PWM signal waveform according to the present invention.

Refer to FIG. 4 a diagram schematically showing a circuit for generating a continuous pulse signal according to the present invention. The circuit 18 of the present invention for generating a continuous pulse signal comprises: a PWM device 20 and a pulse continuity detector 22 coupled to the PWM device 20. Similar to the conventional PWM device 10 of FIG. 1, the PWM device 20 comprises: a comparator 201, a comparator 202 and a ramp signal generator 203. The comparator 201 receives two DC reference voltages V+ and V− and outputs a clock signal, wherein the DC reference voltage V+ is greater than the DC reference voltage V−. The ramp signal generator 203 is coupled to the comparator 201 to receive the clock signal and outputs a ramp signal to the comparator 201, and the value of the ramp signal is between the high DC reference voltage V+ and the low DC reference voltage V−. The ramp signal is not necessarily the triangular waveform shown in FIG. 2 but may be a sawtooth waveform. As the way whereby the PWM device 20 generates a ramp signal in the present invention is the same as the conventional PWM device 10, it will not repeat herein. The comparator 202 is coupled to the comparator 201 and the ramp signal generator 203. The comparator 202 receives the ramp signal from the ramp signal generator 203 and also receives an input signal $S_{in}$. The comparator 202 compares the ramp signal with the input signal $S_{in}$ and outputs a PWM signal. Refer to FIG. 5A a diagram schematically showing the waveforms of a clock signal, a ramp signal and an input signal $S_{in}$. Refer to FIG. 5B for a PWM signal output by the comparator 202.

Figure 5C:
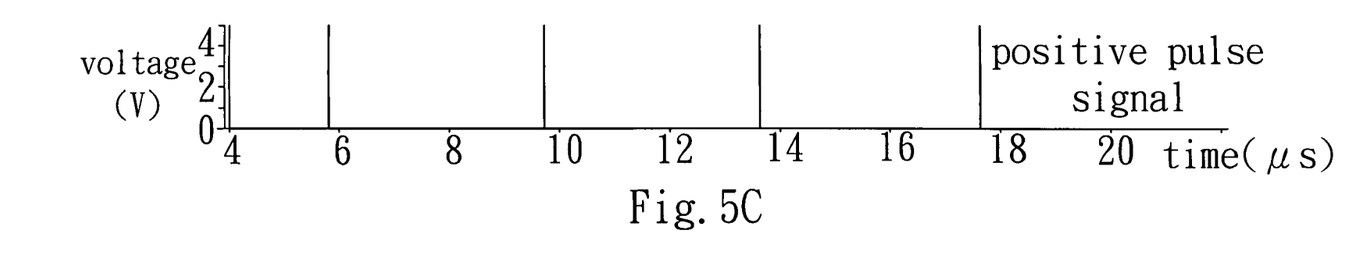
FIG. 5C is a diagram schematically showing a positive pulse signal waveform according to the present invention.
Figure 5D:
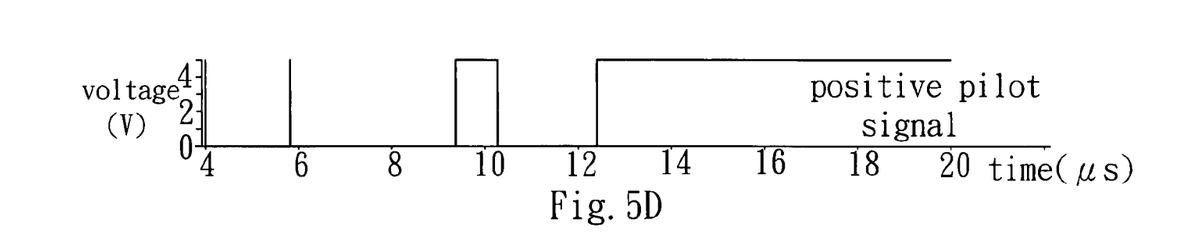
FIG. 5D is a diagram schematically showing a positive pilot signal waveform according to the present invention.
Figure 5E:
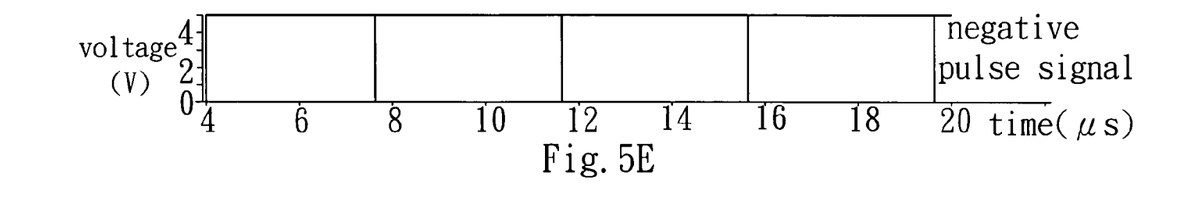
FIG. 5E is a diagram schematically showing a negative pulse signal waveform according to the present invention.
Figure 5F:
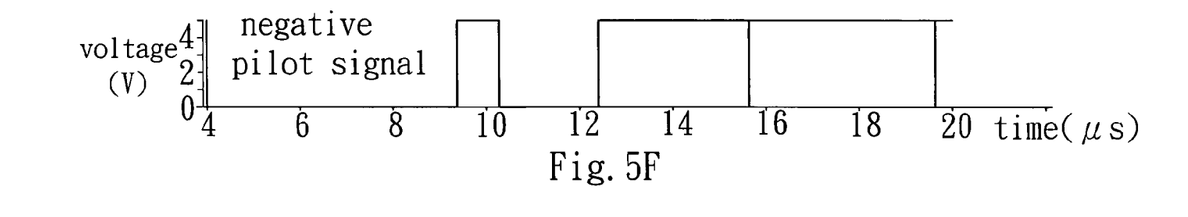
FIG. 5F is a diagram schematically showing a negative pilot signal waveform according to the present invention.
Figure 5G:
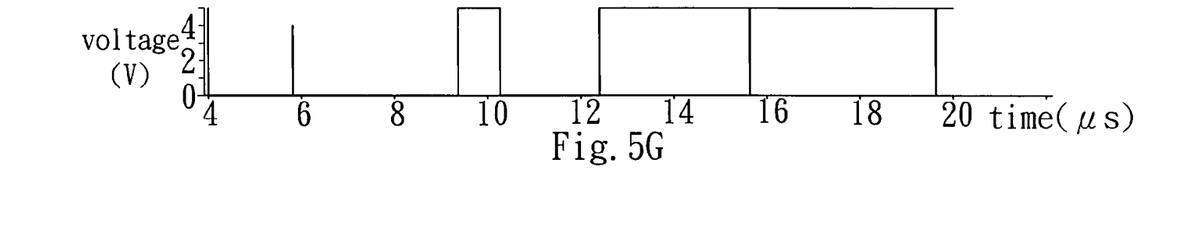
FIG. 5G is a diagram schematically showing the waveform of a signal output by a multiplexer according to the present invention.

The pulse continuity detector 22 further comprises: a positive pilot signal generator 24, a negative pilot signal generator 26 and a multiplexer 28. The positive pilot signal generator 24 further includes: a positive pulse signal generator 241 and an OR gate 242 coupled to the positive pulse signal generator 241. The positive pulse signal generator 241 is coupled to the comparator 201 to receive the clock signal. At a descending edge of the clock signal, the positive pulse signal generator 241 outputs a positive pulse signal to the OR gate 242, wherein the positive pulse signal is a narrow pulse signal shown in FIG. 5C. In addition to receiving the positive pulse signal, the OR gate 242 is also coupled the comparator 202 to receive the PWM signal and then outputs a positive pilot signal. Refer to FIG. 5D. When the positive pulse signal is a high-level signal and the PWM signal is a low-level signal, the positive pilot signal output by the OR gate 242 is the positive pulse signal. When the positive pulse signal is a low-level signal and the PWM signal is a high-level signal, the positive pilot signal output by the OR gate 242 is the PWM signal. When both the positive pulse signal and the PWM signal are high-level signals, the positive pilot signal output by the OR gate 242 is the positive pulse signal or the PWM signal. When both the positive pulse signal and the PWM signal are low-level signals, the positive pilot signal output by the OR gate 242 is a low-level signal. The negative pilot signal generator 26 further includes: a negative pulse signal generator 261 and an AND gate 262 coupled to the negative pulse signal generator 261. The negative pulse signal generator 261 is coupled to the comparator 201 to receive the clock signal. At an ascending edge of the clock signal, the negative pulse signal generator 261 outputs a negative pulse signal to the AND gate 262, wherein the negative pulse signal is a narrow pulse signal shown in FIG. 5E. In addition to receiving the negative pulse signal, the AND gate 262 is also coupled the comparator 202 to receive the PWM signal and then outputs a negative pilot signal. Refer to FIG. 5F. When both the negative pulse signal and the PWM signal are high-level signals, the negative pilot signal output by the AND gate 262 is the negative pulse signal or the PWM signal. When both the negative pulse signal and the PWM signal are low-level signals, the negative pilot signal output by the AND gate 262 is a low-level signal. When either the negative pulse signal or the PWM signal is a low-level signal, the negative pilot signal output by the AND gate 262 is a low-level signal. The multiplexer 28 is coupled to the comparator 202, the positive pilot signal generator 24 and the negative pilot signal generator 26 to receive the PWM signal, the positive pilot signal and the negative pilot signal. Then, the multiplexer 28 outputs the positive or negative pilot signal according to the PWM signal. Refer to FIG. 5G for the waveform output by the multiplexer 28. When the PWM signal is a high-level signal, the multiplexer 28 outputs the negative pilot signal. When the PWM signal is a low-level signal, the multiplexer 28 outputs the positive pilot signal.

Figure 6:
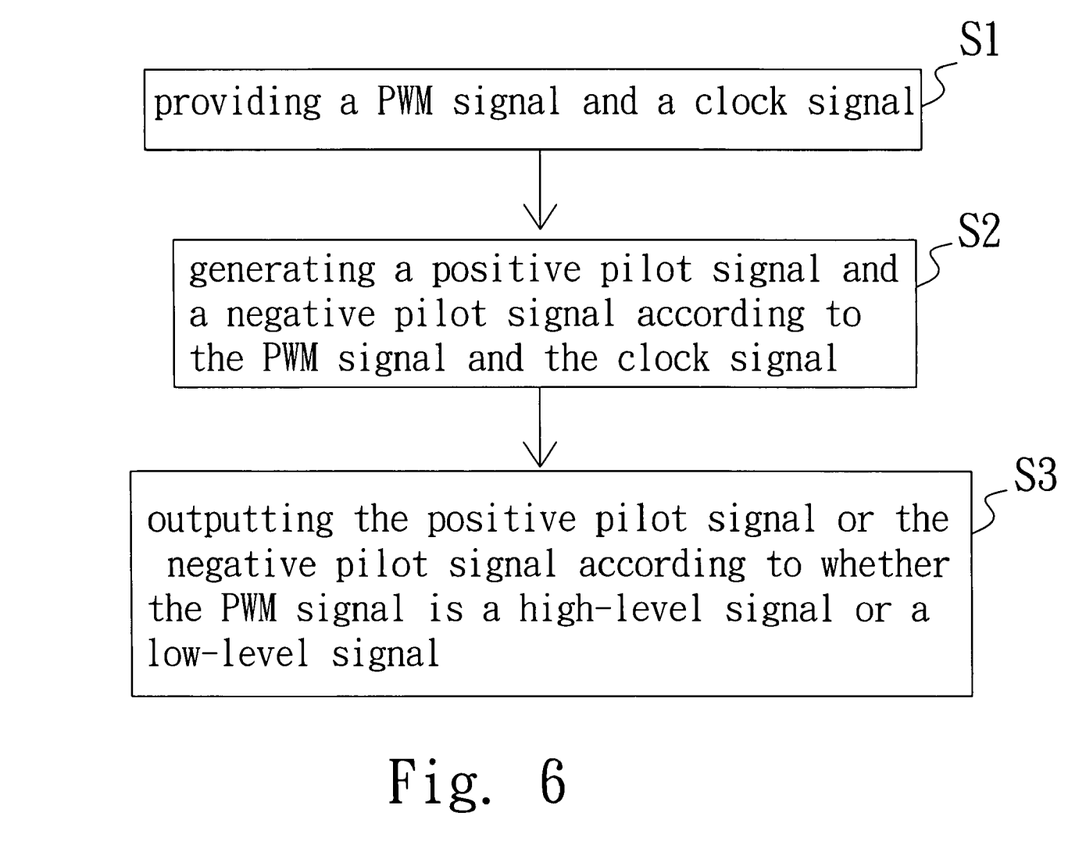
FIG. 6 is a flowchart of a method for generating a continuous pulse signal according to the present invention.

Refer to FIG. 6 a flowchart of a method for generating a continuous pulse signal according to the present invention. In Step S1, a PWM device provides a PWM signal and a clock signal. In Step S2, a positive pilot signal generator and a negative pilot signal generator both receive the PWM signal and the clock signal, and then the positive pilot signal generator and the negative pilot signal generator generate a positive pilot signal and a negative pilot signal, respectively. In Step S3, a multiplexer receives the PWM signal, the positive pilot signal and the negative pilot signal and then outputs the positive or negative pilot signal according to whether the PWM signal is a high-level signal or a low-level signal. When the PWM signal is a high-level signal, the multiplexer outputs the negative pilot signal. When the PWM signal is a low-level signal, the multiplexer outputs the positive pilot signal. The principles and detailed technical contents of the PWM device, the positive pilot signal generator and the negative pilot signal generator will not repeat herein since they have been described in the preceding paragraphs.

In conclusion, the present invention proposes a circuit and method for generating a continuous pulse signal, wherein a pulse continuity detector cooperates with a conventional PWM device to generate a continuous pulse signal and solve the conventional problem of discontinuous pulses.

The embodiments described above are only to exemplify the characteristics and technical contents of the present invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. A circuit for generating a continuous pulse signal comprising:
   a pulse width modulation (PWM) device generating a clock signal and a PWM signal; and
   a pulse continuity detector further comprising:
      a positive pilot signal generator coupled to said PWM device to receive said clock signal and said PWM signal, and outputting a positive pilot signal;
      a negative pilot signal generator coupled to said PWM device to receive said clock signal and said PWM signal, and outputting a negative pilot signal; and
      a multiplexer coupled to said PWM device, said positive pilot signal generator and said negative pilot signal generator to receive said PWM signal, said positive pilot signal and said negative pilot signal, and outputting said positive pilot signal or said negative pilot signal according to said PWM signal.

2. The circuit for generating a continuous pulse signal according to claim 1, wherein when said PWM signal is a high-level signal, said multiplexer outputs said negative pilot signal; when said PWM signal is a low-level signal, said multiplexer outputs said positive pilot signal.

3. The circuit for generating a continuous pulse signal according to claim 1, wherein said PWM device includes:
   a first comparator receiving a first DC reference voltage and a second DC reference voltage to generate said clock signal, wherein said first DC reference voltage is higher than said second DC reference voltage;
   a ramp signal generator coupled to said first comparator to receive said clock signal, and outputting a ramp signal between said first DC reference voltage and said second DC reference voltage; and
   a second comparator coupled to said first comparator and said ramp signal generator, receiving said ramp signal and an input signal, and comparing said ramp signal with said input signal to output said PWM signal.

4. The circuit for generating a continuous pulse signal according to claim 3, wherein said ramp signal has a triangular waveform or a sawtooth waveform.

5. The circuit for generating a continuous pulse signal according to claim 1, wherein said positive pilot signal generator includes: a positive pulse signal generator and an OR gate coupled to said positive pulse signal generator; said positive pulse signal generator receives said clock signal; at a descending edge of said clock signal, said positive pulse signal generator outputs a positive pulse signal; said OR gate receives said positive pulse signal and said PWM signal and then outputs said positive pilot signal.

6. The circuit for generating a continuous pulse signal according to claim 5, wherein when said positive pulse signal is a high-level signal and said PWM signal is a low-level signal, said positive pilot signal is said positive pulse signal; when said positive pulse signal is a low-level signal and said PWM signal is a high-level signal, said positive pilot signal is said PWM signal; when both said positive pulse signal and said PWM signal are high-level signals, said positive pilot signal is said positive pulse signal or said PWM signal; when both said positive pulse signal and said PWM signal are low-level signals, said positive pilot signal is a low-level signal.

7. The circuit for generating a continuous pulse signal according to claim 5, wherein said positive pulse signal is a narrow pulse signal.

8. The circuit for generating a continuous pulse signal according to claim 1, wherein said negative pilot signal generator includes: a negative pulse signal generator and an AND gate coupled to said negative pulse signal generator; said negative pulse signal generator receives said clock signal; at an ascending edge of said clock signal, said negative pulse signal generator outputs a negative pulse signal; said AND gate receives said negative pulse signal and said PWM signal and then outputs said negative pilot signal.

9. The circuit for generating a continuous pulse signal according to claim 8, wherein when both said negative pulse signal and said PWM signal are high-level signals, said negative pilot signal is said negative pulse signal or said PWM signal; when both said negative pulse signal and said PWM signal are low-level signals, said negative pilot signal output is a low-level signal; when either said negative pulse signal or said PWM signal is a low-level signal, said negative pilot signal is a low-level signal.

10. The circuit for generating a continuous pulse signal according to claim 8, wherein said negative pulse signal is a narrow pulse signal.

11. A method for generating a continuous pulse signal comprising:
   providing a PWM signal and a clock signal;
   generating a positive pilot signal and a negative pilot signal according to said PWM signal and said clock signal; and
   outputting said positive pilot signal or said negative pilot signal according to whether said PWM signal is a high-level signal or a low-level signal.

12. The method for generating a continuous pulse signal according to claim 11, wherein when said PWM signal is a high-level signal, said negative pilot signal is output; when said PWM signal is a low-level signal, said positive pilot signal is output.

13. The method for generating a continuous pulse signal according to claim 11, wherein said positive pilot signal is generated by a positive pilot signal generator; said positive pilot signal generator includes: a positive pulse signal generator and an OR gate coupled to said positive pulse signal generator; said positive pulse signal generator receives said clock signal; at a descending edge of said clock signal, said positive pulse signal generator outputs a positive pulse signal; said OR gate receives said positive pulse signal and said PWM signal and then outputs said positive pilot signal.

14. The method for generating a continuous pulse signal according to claim 13, wherein when said positive pulse signal is a high-level signal and said PWM signal is a low-level signal, said positive pilot signal is said positive pulse signal; when said positive pulse signal is a low-level signal and said PWM signal is a high-level signal, said positive pilot signal is said PWM signal; when both said positive pulse signal and said PWM signal are high-level signals, said positive pilot signal is said positive pulse signal or said PWM signal; when both said positive pulse signal and said PWM signal are low-level signals, said positive pilot signal is a low-level signal.

15. The method for generating a continuous pulse signal according to claim 13, wherein said positive pulse signal is a narrow pulse signal.

16. The method for generating a continuous pulse signal according to claim 11, wherein said negative pilot signal is generated by a negative pilot signal generator; said negative pilot signal generator includes: a negative pulse signal generator and an AND gate coupled to said negative pulse signal generator; said negative pulse signal generator receives said clock signal; at an ascending edge of said clock signal, said negative pulse signal generator outputs a negative pulse signal; said AND gate receives said negative pulse signal and said PWM signal and then outputs said negative pilot signal.

17. The method for generating a continuous pulse signal according to claim 16, wherein when both said negative pulse signal and said PWM signal are high-level signals, said negative pilot signal is said negative pulse signal or said PWM signal; when both said negative pulse signal and said PWM signal are low-level signals, said negative pilot signal output is a low-level signal; when either said negative pulse signal or said PWM signal is a low-level signal, said negative pilot signal is a low-level signal.

18. The method for generating a continuous pulse signal according to claim 16, wherein said negative pulse signal is a narrow pulse signal.

19. The method for generating a continuous pulse signal according to claim 11, wherein a multiplexer receives said positive pilot signal, said negative pilot signal and said PWM signal; said multiplexer outputs said positive pilot signal or said negative pilot signal according to said PWM signal.

* * * * *